United States Patent [19]

Muraoka et al.

[11] Patent Number: 4,528,745

[45] Date of Patent: Jul. 16, 1985

[54] METHOD FOR THE FORMATION OF BURIED GATES OF A SEMICONDUCTOR DEVICE UTILIZING ETCH AND REFILL TECHNIQUES

[75] Inventors: Kimihiro Muraoka, Yokohama, Japan; 40

[73] Assignee: Toyo Denki Seizo Kabushiki Kaisha, Tokyo, Japan

[21] Appl. No.: 511,193

[22] Filed: Jul. 6, 1983

[30] Foreign Application Priority Data

Jul. 13, 1982 [JP] Japan .................................. 57-120459
Jul. 13, 1982 [JP] Japan .................................. 57-120460
Jul. 13, 1982 [JP] Japan .................................. 57-120461
Aug. 26, 1982 [JP] Japan .................................. 57-146957

[51] Int. Cl.³ ...................... H01L 21/20; H01L 21/74
[52] U.S. Cl. ................................... 29/576 E; 29/571;
29/578; 29/580; 148/175; 148/188; 148/191;
148/DIG. 37; 148/DIG. 39; 148/DIG. 50;
148/DIG. 88; 357/22; 357/56; 357/88
[58] Field of Search .................... 29/571, 576 E, 578,
29/580; 148/175, 188, 187, 191; 357/22, 56, 88

[56] References Cited

U.S. PATENT DOCUMENTS

| | | | |
|---|---|---|---|
| 3,753,803 | 8/1973 | Nomura et al. | 148/175 |
| 3,969,746 | 7/1976 | Kendall et al. | 148/175 |
| 4,115,793 | 9/1978 | Nishizawa | 357/22 |
| 4,171,995 | 10/1979 | Nishizawa et al. | 148/175 |
| 4,199,771 | 4/1980 | Nishizawa et al. | 29/571 X |
| 4,375,124 | 3/1983 | Cogan | 29/571 |
| 4,434,433 | 2/1984 | Nishizawa | 357/22 |
| 4,466,173 | 8/1984 | Baliga | 29/576 E X |

Primary Examiner—William G. Saba
Attorney, Agent, or Firm—Stevens, Davis, Miller & Mosher

[57] ABSTRACT

A method for the formation of buried gates in a semiconductor device using epitaxial growing method combined with diffusion method or diffusion by an additional heat treatment. The buried gate has smaller gate resistance by providing relatively high impurity concentration and also having good reverse characteristic by providing relatively low impurity concentration at the top of the buried gates.

7 Claims, 31 Drawing Figures

PRIOR ART FIG.1a
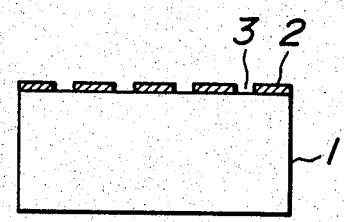
FIG.2a PRIOR ART
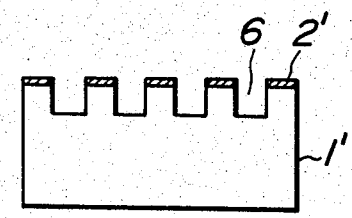
PRIOR ART FIG.1b
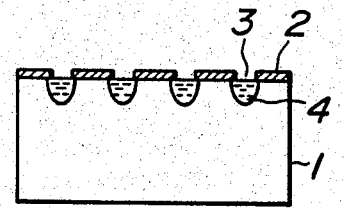
FIG.2b PRIOR ART
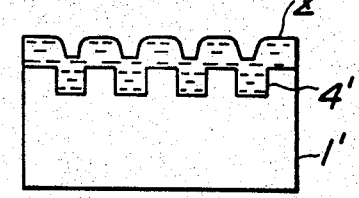
PRIOR ART FIG.1c
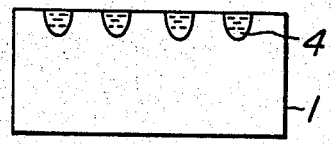
FIG.2c PRIOR ART
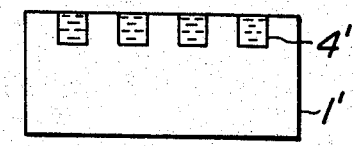
PRIOR ART FIG.1d
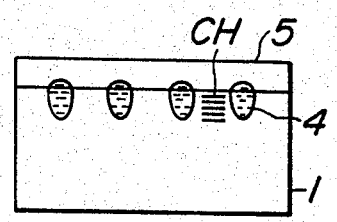
FIG.2d PRIOR ART
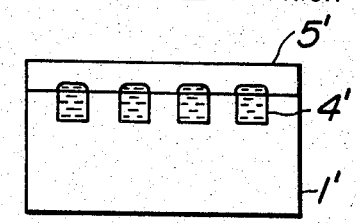

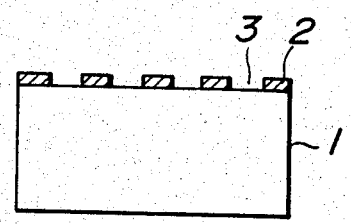
FIG._11a
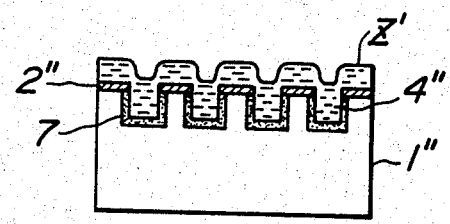
FIG._11d
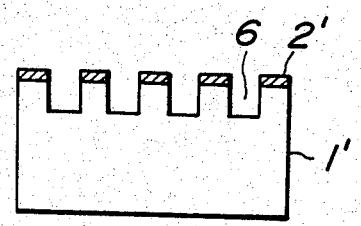
FIG._11b
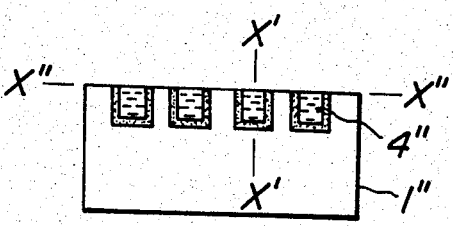
FIG._11e
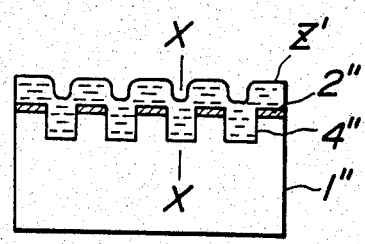
FIG._11c
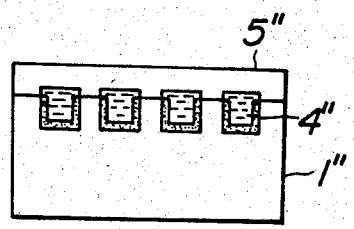
FIG._11f

METHOD FOR THE FORMATION OF BURIED GATES OF A SEMICONDUCTOR DEVICE UTILIZING ETCH AND REFILL TECHNIQUES

BACKGROUND OF THE INVENTION (1) Field of the Invention

The present invention relates to a method for the formation of buried gates of a semiconductor device, such as a static induction type thyristor or a gate turn-off thyristor, and in general to that of a buried gate type semiconductor device equipped with such buried gates.

(2) Description of the Prior Art

In a buried gate type semiconductor device, it is known that a faster switching speed is obtained at smaller gate resistance value. This is based on a fact that the electric signal transmission is effected through the buried gates. In this connection, it has been an important problem how to make the gate resistance value smaller.

The following two methods are the main ones among the known methods which have been used for the formation of buried gates in the buried gate type semiconductor devices.

(1) The gate is first formed by using diffusion method and thereafter the buried gates are formed by applying epitaxial growing on the surface thereof.

(2) Reentrant cut-in grooves are formed on top surface of a silicon substrate. Then the gates are formed by applying epitaxial growing in the grooves. The epitaxial growing is further applied above the gate surface and the buried gates are realized.

These known methods will be explained briefly for helping better understanding of the present invention by referring to the accompanying drawings.

FIGS. 1a to 1d are vertical cross-sectional views for briefly explaining the steps of formation of the buried gates by using the diffusion method. In view of convenience for the explanation, we may assume, as a practical embodiment that the substrate is N type and the gates are P type.

In FIG. 1a, reference numeral 1 designates the substrate, 2 is an oxide film and 3 is a window selectively provided in said oxide film.

In FIG. 1b, reference numeral 4 designate a gate formed by diffusion of P type impurity through the window 3.

FIG. 1c shows a step of removing the oxide film after the formation of the gate 4.

FIG. 1d shows a step of growing n-type silicon single crystal layer 5 on the surface having the gates 4 formed by epitaxial growing method. In this figure, CH illustrates a channel region forming a passage for the electric current.

When the gates 4 are formed by using the diffusion method as just has been described above, it is inevitably required to increase the surface concentration of the P type impurity at the time of diffusion of the gates. However, this may accompany the following disadvantages. For instance, in a known method, boron has widely been used as the impurity element for the diffusion of the P type gate. This is by a reason that boron has a masking effect for the oxide film and it produces a high surface concentration. But boron has relatively small atomic radius which is about 74% of that of silicon. Therefore, when such boron is diffused to obtain a high surface concentration of an order of $10^{19}$–$10^{20}$ (atoms/cc), crystal defects may be induced in lateral direction from the P type gate diffusion region, i.e. in the channel region CH. When n-type silicon single crystal layer having low impurity concentration of an order of $10^{14}$–$10^{15}$ (atoms/cc) is epitaxially grown on a surface including the abovementioned crystal defects, a phenomenon termed as auto-doping in epitaxial growth may occur. In this phenomenon, adjacent P-gates arranged in a very narrow interval decided by the device design may be short-circuited so that the corresponding channel region may be closed. As mentioned above, when the gates are formed by diffusion method, it is necessary to prevent occurrence of such closure of the channel region even by sacrificing the gate resistance. This has been a big drawback in the use of the diffusion method for the manufacture of the semiconductor devices having buried gates.

FIGS. 2a to 2d show steps of manufacturing semiconductor device using epitaxial growing method. These figures show corresponding steps with those shown in FIGS. 1a to 1d. In these FIGS. 2a to 2d, reference numeral 6 shows a cutting groove. Z illustrates an epitaxial growing layer. Namely, in FIG. 2a, 1' is the substrate and 2' is the oxide film. The cutting groove 6 is a groove formed in the substrate 1' and this groove can be formed easily by conventional manner through dry or wet etching using the oxide film 2' as the mask. FIG. 2b shows a condition in which the oxide film 2' of FIG. 2a is removed and then gates 4' are formed by applying P-type epitaxial growing on the surface having the cutting grooves 6 and thereafter the P-type epitaxial layer is further deposited thereon. By applying mirror polishing to the surface of the P-type epitaxial grown layer Z, a product shown in FIG. 2c can be obtained. Thereafter, by growing n-type silicon single crystal layer 5' on to the top surface having gates 4' formed, the buried gates are completed as shown in FIG. 2d.

In accordance with the abovementioned epitaxial growing method, the gate resistance can be made smaller since the distribution of the impurity concentration in the gates 4' is relatively uniform. For instance, if we assume that the impurity density of this gate 4' is the same order of the surface impurity density of the gate 4 manufactured in the steps shown in FIGS. 1a to 1d, the gate resistance obtained through the epitaxial growing method is smaller by about (1/5) to (1/10) compared with that obtained through the diffusion method. The reason for this is based on the fact that in the diffusion method, the impurity concentration distribution decreases exponentially from the surface towards the bottom. Accordingly, when observed from a view point to decrease the gate resistance, the epitaxial growing method is more beneficial. However, this epitaxial growing method has still drawbacks in that the reverse characteristics are not good, for instance, to result an increase of the leakage current at gate junction due to the fact that the crystallization is not complete at the boundary surface of the gate and the substrate since the epitaxial growing is applied in the deep cut groove as mentioned above. If the impurity concentration is made higher uniformly, channel closure may be caused at the time of the epitaxial growing. As the result, the epitaxial growing method is not satisfactory to manufacture the products in the commercial base.

SUMMARY OF THE INVENTION

The present invention is to mitigate the inconveniences of the aforementioned conventional methods.

The present invention is to realize a novel buried gate forming method in which the diffusion method and the epitaxial growing method are combined in parallel and more particularly to keep all the merit of the epitaxial growing method.

BRIEF EXPLANATION OF THE DRAWINGS

FIGS. 1a to 1d, just explained in the foregoing, are vertical cross-sectional views for showing very schematically the steps of formation of buried gates by using the conventional diffusion method;

FIGS. 2a to 2d, just explained in the foregoing, are vertical cross-sectional views for showing very schematically the steps of formation of buried gates by using the conventional epitaxial growing method;

FIGS. 11a to 11f are vertical cross-sectional views for showing schematically consecutive steps of formation of the buried gates according to fourth embodiment of the present invention;

DESCRIPTION FOR THE PREFERRED EMBODIMENTS OF THE INVENTION

Figure 3A:
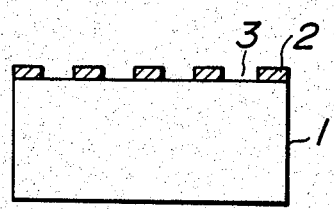
FIGS. 3a to 3g are vertical cross-sectional views for showing schematically steps of formation of buried gate according to a first embodiment of the present invention.

The invention will now be described by referring to the accompanying drawings.

First Embodiment

FIGS. 3a–3g show schematically a first embodiment of the present invention. The corresponding portions with that shown in any one of FIG. 1 or FIG. 2 are shown by using the same reference numerals. Each drawing in FIG. 3 is expressed in the same way as in FIG. 1 and FIG. 2. But in the following explanation, a practical embodiments of the invention is explained by using different reference numerals.

Figure 3B:
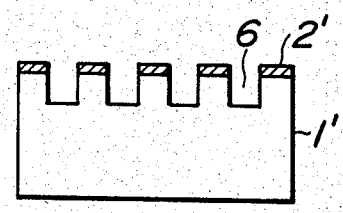

FIGS. 3a and 3b show formation of cutting grooves 6 of 15 ($\mu$m) in the depth on an N-type substrate 1, 1' having the resistivity 100 ($\Omega$cm) and the thickness of 250 ($\mu$m) by using windows 3 of 20 ($\mu$m) width selectively provided in an oxide film 2, 2' of 2 ($\mu$m) thickness forming the mask. This kind of cutting grooves 6 may easily be formed in a manner, for instance, as has been described with referring to FIGS. 2a to 2d.

Figure 3C:
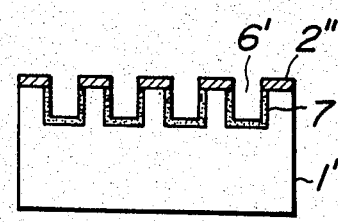
Figure 3D:
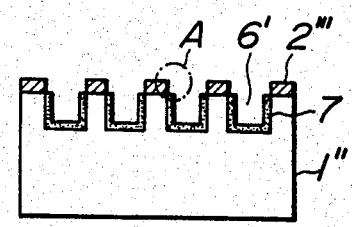
Figure 3E:
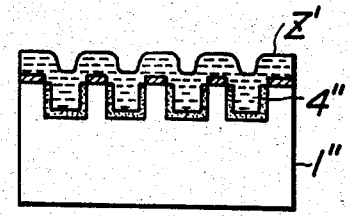
Figure 3F:
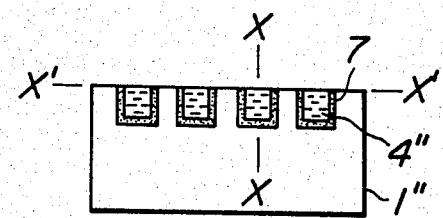
Figure 3G:
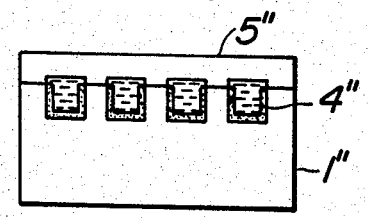
Figure 4:
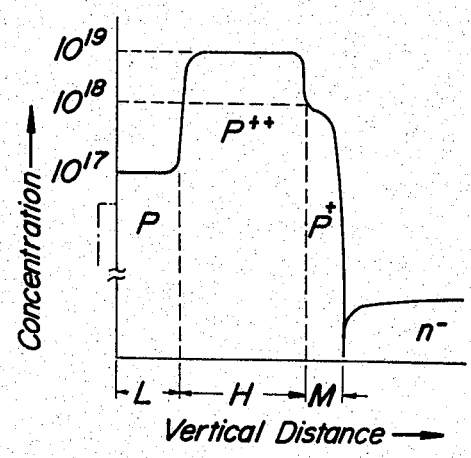
FIG. 4 is a graph for showing vertical distribution of the impurity concentration in the buried gate of the first embodiment.

FIG. 3c shows a step of formation of P-type diffusion layer 7 formed on inner surface of the cutting groove 6' extending in a reentrant form in the substrate 1" with the oxide film 2" using boron as the impurity. The P-type diffusion layer 7 has the P-type impurity surface concentration of $(1 \times 10^{18})$ (atoms/cc) and is formed at a depth of (3–5) ($\mu$m). This P-type diffusion layer 7 can be made in a hard characteristic in the reverse voltage in the gate junction because the boron surface concentration is comparatively low at an order of $(1 \times 10^{18})$ (atoms/cc) and the inner surface of the cutting groove 6' is formed by the diffusion method. In the next step shown in FIG. 3d, the surface portion of the oxide film 2" is removed after the diffusion of boron up to a depth of the boron diffusion by using photo-resist technique to form an oxide film 2''' of which the surface portion is removed. FIG. 3e shows a step in which the cutting groove 6' is buried by P-type epitaxial layer by doping of the P-type impurity. The P-type epitaxial layer Z' is also grown on the oxide film 2''' at the same time with epitaxial growing. In FIG. 3e, 4" shows a portion to be formed as the gate. After forming the step in FIG. 3e, the oxide film 2''' and the P-type epitaxial growing layer Z' are both removed by mirror polishing to form a shape of FIG. 3f. After this step, n-type silicon single crystal layer 5" having concentration of $10^{14}$–$10^{15}$ (atoms/cc) is applied in a thickness of 15–20 ($\mu$m) on the mirror surface in order to bury the gates into the structure as shown in the step of FIG. 3g.

As has been explained above, the device made in accordance with the present invention in the steps shown in FIG. 3, has a particular feature in that it has 2 portions having different values of the P-type impurity concentration. As shown in FIG. 3d, the substrate 1" is provided with cutting groove 6'. On the inner surface of the reentrant shaped groove 6', P-type impurity boron is diffused to form P-type diffusion layer 7. Further the portion of the cutting groove 6' is buried by the epitaxial growing layer.

This will be explained in more detail with practical value. The P-type diffusion layer 7 formed by the diffusion method has the surface impurity concentration in an order of $(1 \times 10^{18})$ (atoms/cc). P-type epitaxial growing layer having boron concentration in an order of $(1 \times 10^{19})$ (atoms/cc) is grown epitaxially on the bottom surface of the reentrant groove having the abovementioned surface impurity concentration by doping boron for silicon tetrachloride in a thickness of 10 ($\mu$m). Further in a direct consecutive step, a P-type epitaxial growing layer having boron concentrations in an order of $(1 \times 10^{17})$ (atoms/cc) is grown thereon in a thickness of 5–7 ($\mu$m). As the result, the portion of the cutting groove 6 having the depth of 15 ($\mu$m) and having reentrant shape is completely filled up. The gate region 4" is formed with two particular steps of the diffusion method and the epitaxial method as shown in FIG. 3g.

Figure 5:
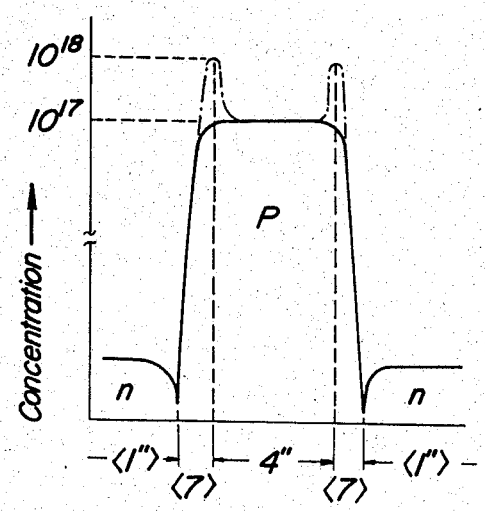
FIG. 5 is a graph for showing horizontal distribution of the impurity concentration at the surface of the buried gate of the first embodiment.
Figure 6:
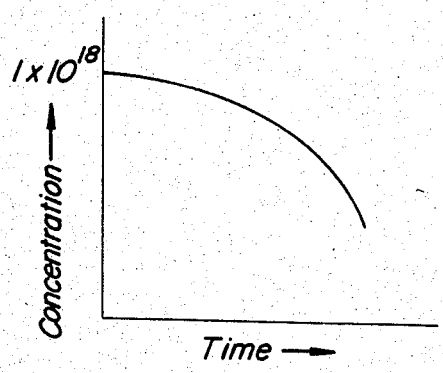
FIG. 6 is a graph experimentally obtained for showing change of the impurity concentration according to the lapse of time.

This relationship will further be explained by referring to FIGS. 4–6. FIG. 4 shows distribution of the impurity concentration viewed from the surface of the gate before it is buried in a direction of depth or its thickness i.e, along the vertical line (X—X) shown in FIG. 3f. FIG. 5 shows distribution of the surface impurity concentration in the gate region along line (X'—X') shown in FIG. 3f. FIG. 6 is a graph showing variation of P-type impurity concentration with the lapse of time at the epitaxial growing. In FIGS. 4 to 6, the ordinate is plotted in logarithmic scale.

Among the FIGS. 4 to 6, at first referring to FIG. 4, the P-type epitaxial growing layer portion having 2 steps of concentration distribution consists of an upper side P layer having the surface concentration of an order of $(1\times10^{17})$ (atoms/cc) and an inner P++ layer having concentration of an order of $(1\times10^{19})$ (atoms/cc). Then in direct contact with the latter, a diffused P+ layer having the surface concentration of an order of $(1\times10^{18})$ (atoms/cc) is situated. In the abovementioned construction of the gate region, the distribution of the concentration viewed from the surface side is a low concentration region L, a high concentration region H and a medium concentration region M as indicated on the abscissa of FIG. 4.

FIG. 5 shows concentration distribution of the exposed surface portion of the gate region 4". From this figure, it can be observed two narrow P-type diffusion layers 7 originally formed by the diffusion method at the surface impurity concentration of $(1\times10^{18})$ (atoms/cc) and then the surface concentration formed by the diffusion method is lowered to an order of $(1\times10^{17})$ (atoms/cc) at the portion of gate region 4" formed by epitaxial growing method and having the surface concentration of $(1\times10^{17})$ (atoms/cc). The main reason for achieving this can be presumed as follows. As can be seen from FIGS. 3c and 3d, and especially from the shape of the oxide film 2" and 2"', the oxide film 2"' is reduced the surface area portion corresponding to the thickness of P-type diffusion layer 7 of the P+ layer. Namely, the P-type diffusion layer 7 changes the surface concentration at the time of the epitaxial growing at the corner of the reentrant groove as illustrated by dotted circle line in FIG. 3d by substantial vaporization of the P-type impurity from the surface of P+ layer to assume distribution as shown in FIG. 5 and the surface concentration shows sudden decrease compared with the other portion of the diffusion layer 7.

This can also be explained by referring to FIG. 6, which shows time variation of the concentration. This has also been confirmed experimentally in which the concentration $(1\times10^{18})$ (atoms/cc) before the epitaxial growing had decreased to $(1\times10^{17})$ (atoms/cc) after the epitaxial growing.

It is a remarkable feature of the method of forming the buried gate in accordance with the present invention in which a consideration is made to suppress the impurity concentration at the exposed surface to lower value in the P+ layer which having high surface concentration. The invention had achieved to provide 3 concentration distribution i.e., relatively low concentration portion (L) at the exposed surface, and relatively high concentration portions (H and M) at inner side.

The invention affords merits as listed below in the characteristics and in the manufacture of the semiconductor device having buried gates with the concentration distribution as shown in FIGS. 4 and 5.

(1) In view of manufacturing (1-1) The concentration of P-gates exposed in the surface is relatively low and is in an order of $10^{17}$ (atoms/cc). This will contribute for suppressing occurrence of the so called "auto-doping phenomena" during the subsequent process of growing n-type epitaxial layer having an opposite conductivity type with that of the gate and the concentration in an order of $10^{14}$–$10^{15}$ (atoms/cc) for completing the buried gates. This prevents with high probability the channel closure so that the manufacturing yield can be improved substantially.

(1-2) The center portion of the P gate is formed of epitaxial growing layer of relatively high concentration of an order to $10^{19}$ (atoms/cc). Therefore, the gate resistance is small and the distance between the gates can be increased substantially. Thus the number of outlet electrodes can be decreased so that the working steps can be simplified.

(2) In view of characteristics (2-1) Since the gate junction is formed by diffusion method, the reverse characteristics are excellent and the leakage current is smaller.

(2-2) Fast switching characteristics can be obtained because the gate resistance value is small.

(2-3) The number of the outlet electrodes can be reduced substantially as set forth above. For instance, the thermal resistance of the element can be decreased correspondingly to an increase of the surface area.

As has been explained in the foregoing, the present invention utilize the diffusion method and the epitaxial growing method in combination so as to realize two steps of concentration distribution in the epitaxial layer and to make the concentration of central portion of the gate higher and to make the concentration of the portion of gate contacting with the conducting layer of the opposite conductivity type lower. The invention affords a novel method of formation of buried type gates of semiconductor device having various advantages and wide utility in the industry.

The invention has been explained for P-gate construction in an N-type substrate. However, the invention can equally be applied for n-gate construction in a P-type substrate.

The invention will further be explained for three more modified embodiments. Since the manufacturing steps are substantially the same, in the second and third embodiment, only the different points from the first embodiment will be explained for these embodiments.

Second Embodiment

In the step of FIG. 3c, the P-type diffusion layer 7 is formed on the inner surface of the reentrant groove 6' using boron as the impurity. In this embodiment, the surface concentration of the P-type impurity boron is made at $(1\times10^{19})$ (atoms/cc) and the depth of the P-type diffusion layer is (3–5) (μm). All the other steps are the same with the first embodiment except the impurity concentration.

Namely, the P-type diffusion layer 7 formed by the diffusion has the surface concentration of $(1\times10^{19})$ (atoms/cc). On the bottom of the reentrant groove having the above mentioned surface impurity concentration, the P-type epitaxial layer having boron concentration in an order of $(1\times10^{18})$ (atoms/cc) is grown by 10 (μm) by using silicon tetrachloride doped with boron. Further in a consecutive step thereto, a P-type epitaxial layer having boron concentration in an order of $(1\times10^{17})$ (atoms/cc) is grown by 5–7 (μm). By these steps, the reentrant groove portion 6 of 15 (μm) in depth is filled up. The gate region 4" is formed by the diffusion method and the epitaxial growing method as shown in FIG. 3g.

The impurity concentration distribution in the gate region 4" of this second embodiment will be explained by referring to FIGS. 7 and 8. These figures correspond to FIGS. 4 and 5 of the first embodiment.

Figure 7:
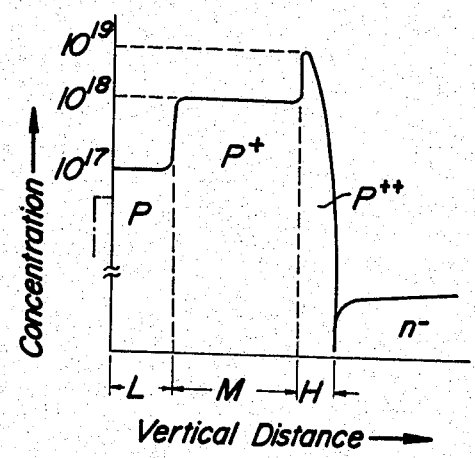
FIGS. 7 and 8 are graphs for showing distribution of the impurity concentration in the same manner of FIGS. 3 and 4 for a second embodiment of the present invention.

In FIG. 7, the P-type epitaxial growing layer having two steps of the impurity concentration is shown. Viewed from the above, there is a P layer having the surface concentration in an order of $(1\times10^{17})$ (atoms/cc) and P+ layer located underneath the P layer and having the surface concentration of $(1\times10^{18})$ (atoms/cc). Further there is a P++ layer in contact thereto and having the surface concentration of $(1\times10^{19})$ (atoms/cc) formed by diffusion. Namely, this P-type gate region consists of three sub-regions, of a low concentration region L, a middle concentration region M and a high concentration region H having increasing concentration from the top towards the bottom.

Figure 8:
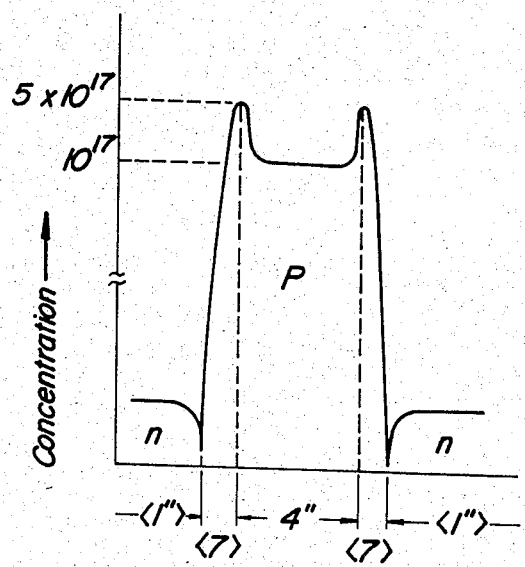

FIG. 8 shows the surface distribution of the concentration in the exposed surface of the gate region 4″. As same as FIG. 5, this figure shows the decrease of the surface concentration of the P-type diffusion layer 7 diffused at the surface concentration of $(1\times10^{19})$ (atoms/cc) to an order of $(5\times10^{17})$ (atoms/cc). This reason is exactly the same with the first embodiment explained by referring to FIGS. 4–6.

This embodiment has the all the merits as explained with respect to the first embodiment. However, this second embodiment has slightly higher gate resistance value and slightly inferior reverse characteristic of the gate junction compared with the first embodiment.

Third Embodiment

In this third embodiment, the P-type diffusion layer 7 is formed on the inner surface of the reentrant groove 6′ using boron as the impurity just as same as the second embodiment and in the step of FIG. 3c. The surface concentration of the P-type impurity boron is made at $(1\times10^{19})$ (atoms/cc) and the depth of the P-type diffusion layer is (3–5) (μm) also same as the second embodiment.

However, in this third embodiment, then a P-type epitaxial layer having boron concentration in an order of $(1\times10^{19})$ (atoms/cc) is grown by 10 (μm) by using silicon tetrachloride doped with boron just like the first embodiment. Then in a consecutive step, P-type epitaxial layer having the boron concentration in an order of $(1\times10^{17})$ (atoms/cc) is grown by 5–7 (μm) also like the first embodiment. The reentrant groove portion 6 having the original depth of 15 (μm) is now filled up. The gate region 4″ provided in combination with the diffusion method and the epitaxial growing method is then buried in n-type layer and thus completed as shown in FIG. 3g.

The impurity concentration distribution in the gate region 4″ of this third embodiment will be explained by referring to FIGS. 9 and 10. These figures exactly correspond to FIGS. 4 and 5 of the first embodiment.

Figure 9:
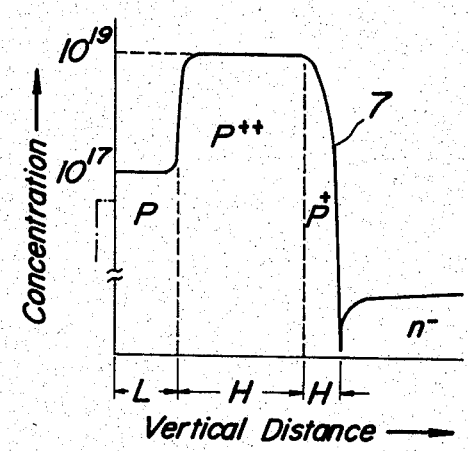
FIGS. 9 and 10 are also graphs for showing distribution of the impurity concentration likewisely with FIGS. 7 and 8 for a third embodiment of the present invention.

In FIG. 9, the P-type epitaxial growing layer is shown to have two steps of the impurity concentration distribution. Viewed from top there is a P layer having the surface impurity concentration in an order of $(1\times10^{17})$ (atoms/cc) and a P++ layer located inner side therefrom having the concentration in an order of $(1\times10^{19})$ (atoms/cc). Further there is P+ diffusion layer 7 in contact to the P++ layer and having the surface concentration of $(1\times10^{19})$ (atoms/cc). The P+ diffusion layer 7 was formed by diffusion.

Namely, this P-type gate region consists of three sub-regions. From the top, a low concentration region L, a high concentration region H and one more region having substantially the same level of concentration with the high concentration region H.

Figure 10:
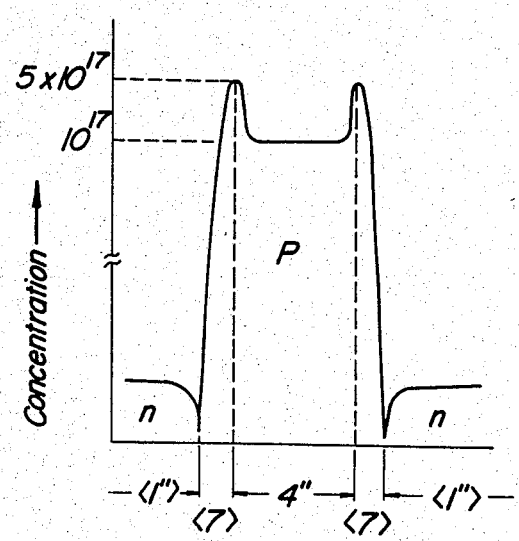

FIG. 10 shows the surface distribution of the concentration in the exposed surface of the gate region 4″. The surface concentration of the portion of gate 4″ originally formed by diffusion and having concentration in an order of $(1\times10^{19})$ (atoms/cc) and at the epitaxial growing layer portion having $(1\times10^{17})$ (atoms/cc) had been decreased to a value of order of $(5\times10^{17})$ (atoms/cc).

The reason of this decrease is the same with other embodiment as mentioned before.

This third embodiment can have still smaller value for gate resistance compared with the first and second embodiment.

Fourth Embodiment

FIGS. 11a to 11f show the manufacturing steps of fourth embodiment of the present invention. In the drawing, the same reference numerals are also used in this embodiment to indicate the same portions with the prior art shown in FIGS. 1 and 2 and with that with other embodiments.

FIGS. 11a and 11b show formation of the cutting grooves 6 of 15 (μm) in the depth on an N-type substrate 1, 1′ having the resistivity 100 (Ωcm) and the thickness of 250 (μm) by utilizing window 3 of 20 (μm) in width selectively provided in an oxide film 2, 2′ of 2 (μm) thickness. As has been explained in the foregoing, such a kind of the cutting groove 6 may easily be formed in a conventional manner, for instance, as described with referring to FIGS. 2a and 2b.

FIG. 11c shows a step in which the cutting groove 6 is filled up by epitaxial growing method using monosilane doped with boron as the P-type impurity and grown at a temperature of 1,050° C. In this epitaxial growing step, P-type epitaxial growing layer Z′ is formed also on the oxide film 2″. In this figure, 4″ is the gate. However, the device thus formed having a configuration that the cutting groove 6 is just buried by the epitaxial growing layer Z′ has still drawback as explained above in that it may cause an increase of the leakage current since the crystallization located at the interface between the substrate 1″ and the epitaxial layer is not complete.

In order to mitigate this drawback, an important step to apply heat treatment is effected at a temperature slightly higher than that of the epitaxial growing, i.e. at about 1,050° C. By applying such a heat treatment for the product as shown in FIG. 11c, a shallow diffusion is effected uniformly into the substrate 1″ from the P-type epitaxial layer Z′ consisting an impurity source. Namely, FIG. 11d shows a step for effecting the heat treatment at 1,100° C. for 3 hours for the product shown in FIG. 11c. In FIG. 11d, a P-type diffusion layer 7 of about 3–5 (μm) is formed. As mentioned above, the heat treatment results movement of the PN-junction between the P-type epitaxial layer and the substrate towards inner side of the substrate 1″ by about 3–5 (μm), where good crystal structure locates. This improves the characteristics of the PN-junction. In addition to this improvement of the feature of the PN-junction, a great advantage can be obtained to prevent the occurrence of channel closure at the time of formation of the buried gate. It is the essential feature of the invention to apply such a heat treatment.

The product shown in FIG. 11d is treated in mirror polishing to remove the oxide layer 2" and the P-type epitaxial layer Z' to obtain a product as shown in FIG. 11e. In order to bury in the gate into said mirror ground surface, n-type silicon single crystal layer 5" having the concentration of $10^{14}$–$10^{15}$ (atoms/cc) is applied thereon by about 15–20 ($\mu$m) to obtain a product shown in FIG. 11f.

As has been explained above, referring to FIG. 11c, the substrate 1" is provided with cutting grooves and the inner surface thereof is buried by P-type epitaxial layer. The P-type impurity concentration distribution shows 2 step portions having difference therebetween and the product is subsequently applied with heat treatment. In more detail, viewed from the bottom of the reentrant groove, a P-type epitaxial layer having the boron concentration in an order of $(1 \times 10^{19})$ (atoms/cc) is grown by 10 ($\mu$m) at a temperature of 1,050° C. by using silane doped with boron. Then in a consecutive step a further P-type epitaxial layer having the boron concentration in an order of $(1 \times 10^{17})$ (atoms/cc) is grown by 5–7 ($\mu$m). By this, the portion of the cutting groove 6 having 15 ($\mu$m) in depth is buried up. Then by applying the heat treatment at a temperature of 1,100° C., which is slightly higher than that of the P-type epitaxial growing, the PN-junction is moved by 3–5 ($\mu$m) towards substrate and the P-type diffusion layer 7 is formed.

The relation of the above will be explained in more detail by referring to FIGS. 12 to 14.

Figure 12:
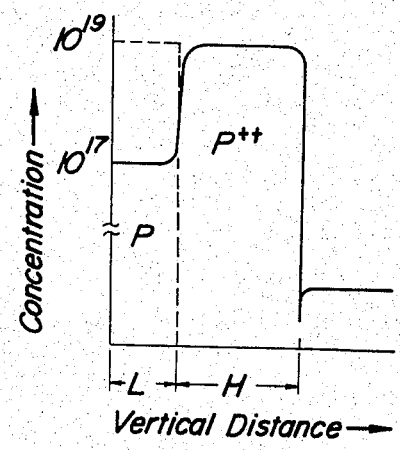
FIG. 12 is a graph for showing vertical distribution of the impurity concentration of the fourth embodiment before applying heat treatment as shown in the step of FIG. 11c.

FIG. 12 represents impurity distribution in vertical direction along a line X—X in FIG. 11c.

Figure 13:
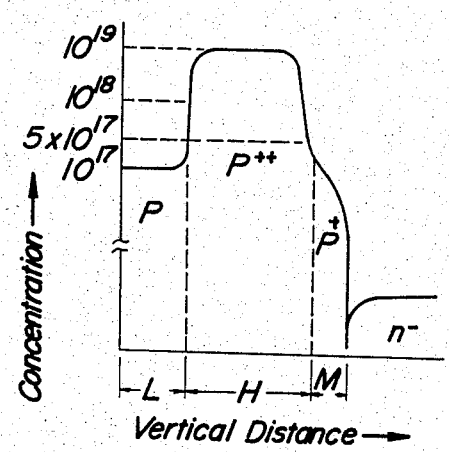
FIG. 13 is a graph for showing change of vertical distribution of the impurity concentration of the fourth embodiment by applying the heat treatment as shown in FIG. 11d.

FIG. 13 represents impurity distribution at a stage before the gates are buried in viewed from the surface towards the direction of thickness along a line X'—X' in FIG. 11e.

Figure 14:
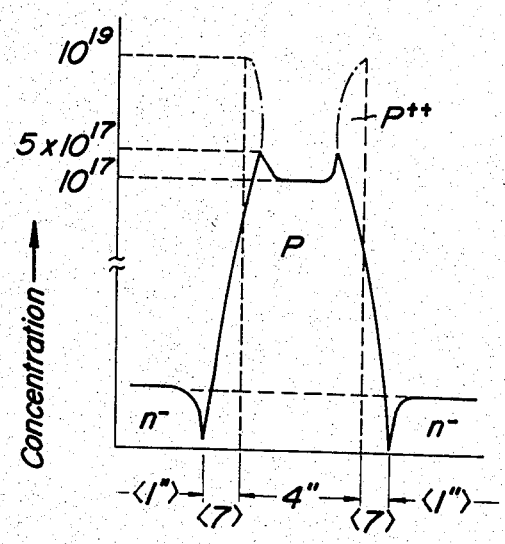
FIG. 14 is a graph for showing horizontal distribution of the impurity concentration at the surface of the gate taken along line X"—X" in FIG. 11e.

FIG. 14 represents impurity distribution at the surface of the gate region along a line X"—X" in FIG. 11e. The ordinate in these FIGS. 12 to 14 is taken in logarithmic scale.

As shown in FIG. 12, the gate region 4" has two steps of the impurity concentration H and L. Namely the bottom portion is the higher concentration region H in an order of $(1 \times 10^{19})$ (atoms/cc) and the upper side is the lower concentration region L in an order of $(1 \times 10^{17})$ (atoms/cc). Whereas in the next step, as shown in FIG. 11e and in FIG. 13, the impurity concentration is changed by the heat treatment. Namely, the P-type epitaxial layer having the two steps of concentration has at its upper side a P layer having the surface impurity concentration in an order of $(1 \times 10^{17})$ (atoms/cc) and at inner side a P++ layer having the impurity concentration in an order of $(1 \times 10^{19})$ (atoms/cc). In contact with this P++ layer, there is located a P+ diffusion layer formed by diffusion by the heat treatment diffused from the P++ layer as the diffusion source. This gate region in the final stage may have impurity concentration of three steps. Namely, viewed from top, a low concentration region L, a high concentration region H and a medium concentration region M. The exposed surface of the gate has lower concentration and the inner side has higher concentration and as a whole there is three steps of impurity concentration.

Then referring to FIG. 14, the high concentration portion of the P-type gate having the concentration in an order of $(1 \times 10^{19})$ (atoms/cc) shows decrease of the impurity concentration to an order of $(5 \times 10^{17})$ (atoms/cc) at the portion in contact with the edge portion of the cutting groove 6. The main portion of the P-type region has the concentration of an order of $(1 \times 10^{17})$ (atoms/cc). This is due to the fact that the high concentration epitaxial layer portion first grown in the reentrant groove causes diffusion into the substrate 1" in the heat treatment step making the high concentration portion as the diffusion source. This decrease from the $(1 \times 10^{19})$ (atoms/cc) formed by epitaxial growing to the above value is also confirmed by experiments.

It is a remarkable feature of the present invention to keep the impurity concentration low especially at the exposed surface of the P++ layer.

This embodiment also has all the advantages of the buried gate as explained with respect to the first embodiment.

Comparison of the Embodiments

The following table shows relative feature of the four embodiments as mentioned above.

In the table, I, II, III and IV shows order of gate resistance from smallest value. But this is just to show relative value and this table does not mean absolute value or feature.

In the table i, ii, ii' and iii show order of reverse characteristics of the gate junction from good value. This does not mean absolute value. ii and ii' show a very small difference.

TABLE

|  | Gate resistance | Reverse characteristics of gate junction |
|---|---|---|
| First embodiment | III | i |
| Second embodiment | IV | ii |
| Third embodiment | I | ii' |
| Fourth embodiment | II | iii |

What is claimed is:

1. A method of forming buried gates in a semiconductor silicon substrate, said method comprising the steps of:
   providing a reentrant shaped groove in said silicon substrate;
   diffusing into said groove a layer having a medium surface impurity concentration;
   epitaxially growing a first layer on said diffusion layer, said first epitaxially grown layer having a higher impurity concentration than said diffusion layer;
   epitaxially growing a second layer on said first epitaxially grown layer, said second layer having a lower impurity concentration than said diffusion layer; and
   providing a single crystal silicon layer over said substrate and said second epitaxially grown layer, said single crystal silicon layer having a conductivity similar to said semiconductor silicon substrate.

2. A method for the formation of buried gates of a semiconductor device as claimed in claim 1, wherein the medium surface impurity concentration is in an order of $(1 \times 10^{18})$ (atoms/cc), said first epitaxially grown layer high impurity concentration is in an order of $(1 \times 10^{19})$ (atoms/cc), and said second epitaxially grown layer low impurity concentration is in an order of $(1 \times 10^{17})$ (atoms/cc).

3. A method of forming buried gates in a semiconductor silicon substrate, said method comprising the steps of:

providing a reentrant shaped groove in said silicon substrate;

diffusing into said groove a layer having a high surface impurity concentration;

epitaxially growing a first layer on said diffusion layer, said first epitaxially grown layer having a lower impurity concentration than said diffusion layer;

epitaxially growing a second layer on said first epitaxially grown layer, said second layer having a lower impurity concentration than said first epitaxially grown layer; and providing a single crystal silicon layer over said substrate and said second epitaxially grown layer, said single crystal silicon layer having a conductivity similar to said semiconductor silicon substrate.

4. A method for the formation of buried gates of a semiconductor device as claimed in claim 3, wherein the relatively high surface impurity concentration is in an order of $(1 \times 10^{19})$ (atoms/cc), said first epitaxially grown layer medium impurity concentration is in an order of $(1 \times 10^{18})$ (atoms/cc), and said second epitaxially grown layer low impurity concentration is in an order of $(1 \times 10^{17})$ (atoms/cc).

5. A method of forming buried gates in a semiconductor silicon substrate, said method comprising the steps of:

providing a reentrant shaped groove in said silicon substrate;

diffusing into said groove a layer having a high surface impurity concentration;

epitaxially growing a first layer on said diffusion layer, said first epitaxially grown layer having a high impurity concentration;

epitaxially growing a second layer on said first epitaxially grown layer, said second layer having a lower impurity concentration than said diffusion layer; and providing a single crystal silicon layer over said substrate and said second epitaxially grown layer, said single crystal silicon layer having a conductivity similar to said semiconductor silicon substrate.

6. A method for the formation of buried gates of a semiconductor device as claimed in claim 5, wherein the relatively high surface impurity concentration is in an order of $(1 \times 10^{19})$ (atoms/cc), said first epitaxially grown layer high impurity concentration is also in an order of $(1 \times 10^{19})$ (atoms/cc), and said second epitaxially grown layer low impurity concentration is in an order of $(1 \times 10^{17})$ (atoms/cc).

7. A method of forming buried gates in a semiconductor silicon substrate, said method comprising the steps of:

providing a reentrant shaped groove in said silicon substrate;

diffusing into said groove a layer of semiconductor material having a surface impurity concentration;

epitaxially growing a first layer on said diffusion layer, said first epitaxially grown layer having a surface impurity concentration;

epitaxially growing a second layer on said first epitaxially grown layer, said second epitaxially grown layer having a surface impurity concentration less than either of said diffusion layer or said first epitaxially grown layer; and providing a single crystal silicon layer over said substrate and said second epitaxially grown layer, said single crystal silicon layer having a conductivity similar to said semiconductor silicon substrate.

* * * * *